United States Patent
You

[11] Patent Number: 5,886,404
[45] Date of Patent: Mar. 23, 1999

[54] BOTTOM LEAD SEMICONDUCTOR PACKAGE HAVING FOLDED LEADS

[75] Inventor: Joong-Ha You, Choongcheongbuk-Do, Rep. of Korea

[73] Assignee: LG Semicon Co., Ltd., Cheongju, Rep. of Korea

[21] Appl. No.: 877,563

[22] Filed: Jun. 17, 1997

[30] Foreign Application Priority Data

Jun. 18, 1996 [KR] Rep. of Korea .................. 21974/1996

[51] Int. Cl.[6] .................................................. H01L 23/48
[52] U.S. Cl. ............................................ 257/692; 257/694
[58] Field of Search .................................. 257/692, 694, 257/787, 697, 773

[56] References Cited

U.S. PATENT DOCUMENTS 5,428,248   6/1995   Cha .
5,616,953   4/1997   King et al. ............................. 257/696

FOREIGN PATENT DOCUMENTS 63-325564   7/1990   Japan ........................................ 257/692
6177308     6/1994   Japan ........................................ 257/593

Primary Examiner—Olik Chaudhuri
Assistant Examiner—N. Kelley
Attorney, Agent, or Firm—Fleshner & Kim

[57] ABSTRACT

A bottom lead semiconductor package includes a plurality of outer leads, wherein an outer portion of each of the outer leads is downwardly bent, and inner leads extend from a corresponding one of the outer leads respectively and are bent at least once upwardly and folded over onto a corresponding upper surface of the outer leads. A semiconductor chip is attached to an upper surface of each of the inner leads by a nonconductive adhesive, and a plurality of conductive wires or bumps electrically couples the chip to the inner leads. A molding compound seals a portion of the package including the chip, the inner leads and the wires, but externally exposes a downwardly bent portion of each of the outer leads.

28 Claims, 3 Drawing Sheets

BOTTOM LEAD SEMICONDUCTOR PACKAGE HAVING FOLDED LEADS

BACKGROUND OF THE INVENTION

1. Field of the Invention

The present invention relates to a chip package, and more particularly, to an improved bottom lead semiconductor package.

2. Background of the Related Art

FIG. 1 illustrates a cross-sectional view of a bottom lead semiconductor package which is disclosed in U.S. Pat. No. 5,428,248, commonly assigned to the same assignee of the present application. The package includes a plurality of leads 2, each including a substrate mounting lead portion 2a, which is mounted at a lower surface of each thereof to a substrate (not shown), and a chip connection lead portion 2b respectively bent upwardly extending from the corresponding substrate mounting lead portion 2a. A semiconductor chip 1 is fixedly attached to respective upper surfaces of the substrate mounting lead portions 2a by an adhesive 3. A plurality of conductive wires 4 electrically connects chip pads 1a on the chip 1 to the chip mounting lead portions 2b. A molded resin compound covering a certain area of the package including the conductive wires 4, the chip 1 and the lead portions 2a, 2b of the leads 2 to form a complete package body 5.

The respective lower surfaces of the substrate connection lead portions 2a are molded but exposed through the lower surface of the package body 5 so that a solder 6 (not shown) may be formed on each of the lower surfaces of the substrate connection lead portions 2a. A substrate connection lead portions 2a are so low so as to be even with the lower surface of the package body 5, which causes various disadvantages. When the lower surface of the package body is fixedly attached to an upper surface of a printed circuit board, heat emission poses a problem. Further, a difference in thermal expansion coefficient between the substrate connection lead portions and the substrate may cause a rupture of the adhered portions. Moreover, when mounted on a printed circuit board, it is very difficult to carry out an external detection for checking a failure, such as a mounting defect.

The above references are incorporated by reference herein where appropriate for appropriate teachings of additional or alternative details, features and/or technical background.

SUMMARY OF THE INVENTION

An object of the present invention is to solve the problems of the related art.

Another object of the present invention is to provide improved heat emission.

A further object of the present invention is to provide improved adhesion.

A further object of the present invention is to provide a chip package allowing improved detection for mounting defects.

To achieve the above described object, there is provided a semiconductor package according to the present invention which includes a plurality of outer leads, an end portion of each of the outer leads being downwardly bent, a plurality of inner leads each extending from a corresponding one of the outer leads and respectively bent upwardly at least once and folded onto a corresponding upper surface of the corresponding outer leads, a semiconductor chip attached to an upper surface of each of the inner leads by a nonconductive adhesive, conductive wires for electrically connecting the chip to the inner leads, and a molding compound for sealing a portion of the package including the chip, the inner leads and the wires but externally exposing a downwardly bent portion of each of the outer leads.

The present invention may be achieved in whole or in part by a chip package comprising a plurality of leads, each having an outer lead and an inner lead, wherein the outer lead has first and second surfaces and an end portion, which is folded in a prescribed direction, and the inner lead extends from a corresponding on of the outer lead and has first and second surfaces and is folded such that the second surface of the inner lead overlaps the first surface of the outer lead; a chip having a plurality of chip pads, the chip being mounted on the plurality of leads; a conductive media coupling the chip pads to corresponding leads; and a package body that molds the chip, the conductive media and the inner lead, and the end portion of the outer lead is exposed.

The present invention may also be achieved in whole or in part by a lead for a chip package comprising an outer lead and an inner lead, wherein the outer lead has first and second surfaces and an end portion, which is folded in a prescribed direction, and the inner lead extends from a corresponding on of the outer lead and has first and second surfaces and is folded such that the second surface of the inner lead overlaps the first surface of the outer lead.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
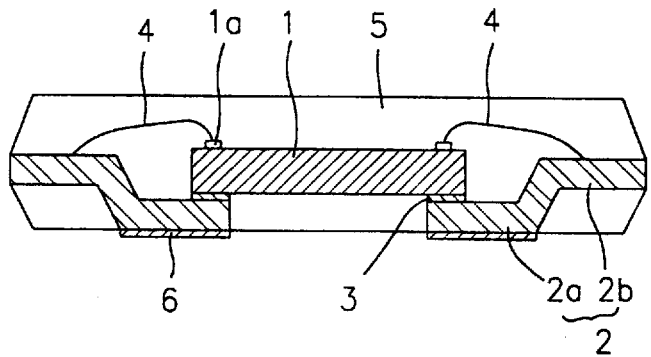
FIG. 1 is a cross-sectional view of a related art bottom lead semiconductor package.
Figure 2A:
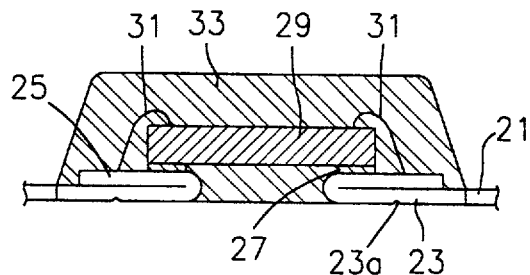
FIG. 2A is a cross-sectional view showing a bottom lead semiconductor package in accordance with the present invention before carrying out a trimming process.

As shown in FIG. 2A, a plurality of outer leads 23, which are spaced a prescribed distance therebetween, are connected to respective lead support bars 21. Inner leads 25 are upwardly bent extending from the respective outer leads 23 and folded onto respective upper surfaces of the outer leads 23 such that the inner leads 25 overlap a prescribed area of the outer leads 23. Preferably, the inner leads 25 are in contact with the outer leads 23. A semiconductor chip 29 is attached to an upper surfaces of the folded inner leads 25 by a nonconductive adhesive 27. Bonding pads (not shown) of the chip 29 are electrically connected to corresponding ones of the inner leads 25 by conductive wires 31 or bumps (not shown). A certain area, including the chip 29, wires 31, inner leads 25 and outer leads 23, is sealed by a molding resin, whereby a molding compound 33 forming the package body has the respective lower surfaces of the outer leads 23 exposed through the bottom thereof.

Figure 2B:
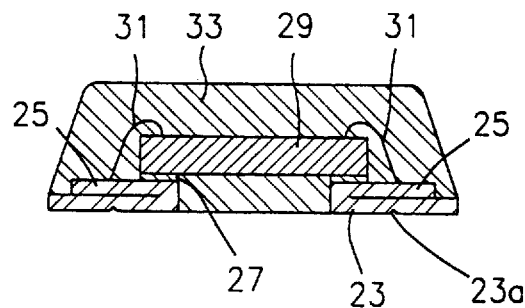
FIG. 2B is a cross-sectional view showing the bottom lead semiconductor package in accordance with the present invention after carrying out a trimming process.

A shallow groove 23a is formed perpendicularly to the outer lead direction in respective lower surfaces of the outer leads 23. Also, the surface of each of the inner leads 25 is preferably plated with silver or gold to thereby facilitate a wire bonding while improving an electrical characteristic thereof. The surface of each of the outer leads 23 is preferably plated with lead or tin to thereby facilitate soldering during mounting of the package on a substrate while preventing the outer leads 23 from corroding. The package structure as shown in FIG. 2B is obtained by trimming the outer lead 23 from the lead support bars 21 and removing the lead support bars 21 protruding from each side of the package.

Figure 2C:
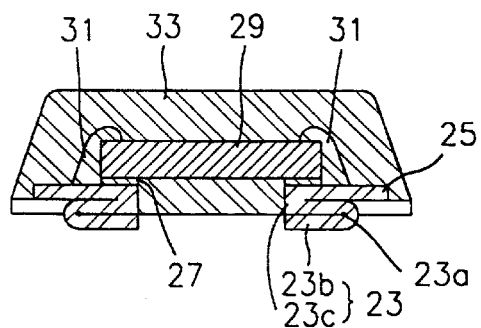
FIG. 2C is a cross-sectional view showing the bottom lead semiconductor package in accordance with the present invention after forming the outer leads.

As further shown in FIG. 2C, an outer end portion 23b (a portion left after the trimming) of each of the outer leads 23 is formed to be downwardly bent and folded back onto a respective lower surface portion 23c of each of the outer leads 23 for thereby completing the bottom lead semiconductor package according to the present invention. At this time, the outer end portion 23b of each of the outer leads 23 is bendingly turned round or folded on the groove 23a which serves as a bending axis thereof, e.g., the groove 23 facilitates the bending of the outer leads 23.

Figure 3:
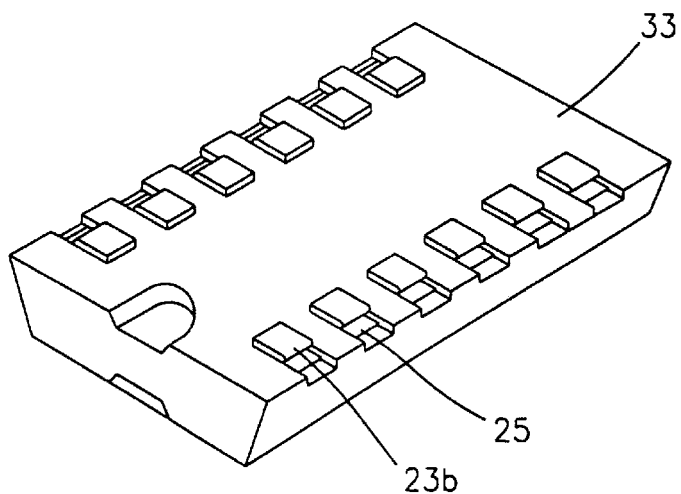
FIG. 3 is a perspective view detailing a bottom surface of the bottom lead semiconductor package in accordance with the present invention.

FIG. 3 illustrates a perspective bottom view of the bottom lead semiconductor package and is provided to show the plurality of outer leads 23c respectively bent over onto the bottom of the package towards the symmetrical center line of the molding compound 33. Here, the outer leads 23b can be bent over as shown in FIG. 2C after carrying out the trimming process as shown in FIG. 2B, for the user's convenience, the lead support bars 21 can be appropriately trimmed away later after bending over the outer leads 23b.

Figure 4:
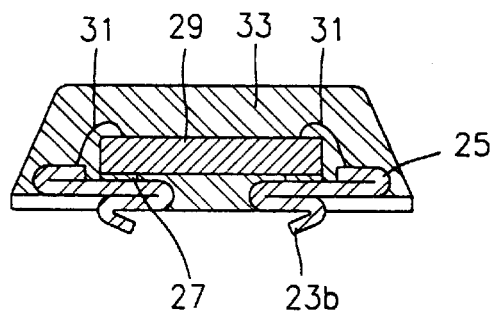
FIGS. 4 through 6 are cross-sectional views respectively showing modified examples of the bottom lead semiconductor package in accordance with the present invention.
Figure 5:
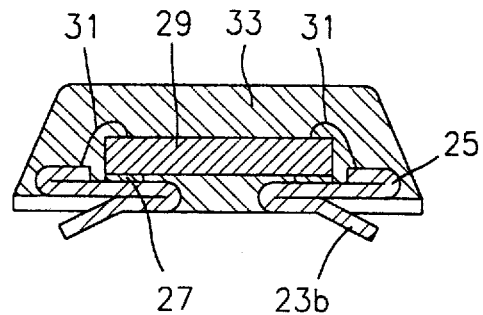
Figure 6:
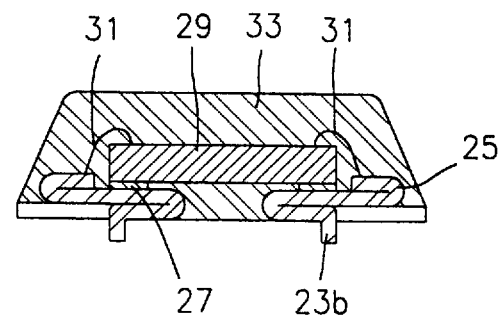

The bottom lead semiconductor package according to the present invention can be variously formed depending on the extent of bending the outer leads, and accordingly, a variety of forms of outer leads will now be described with reference to FIGS. 4 through 6. As shown in FIG. 4, the outer leads 23b can be slantingly bent inwardly toward a symmetrical center line of the molding compound 33. Also, as shown in FIG. 5, the outer leads 23b can be slantingly bent outwardly toward each edge of the molding compound 33. Further, as shown in FIG. 6, the outer leads 23b can be bent over to be perpendicular to the lower surface of the molding compound 33. Besides those modifications specified above, a variety of different formations are feasible within the technological scope of the present invention.

As shown in FIGS. 4–6, an inner end portion of each of respective inner leads 25 is upwardly and inwardly bent over onto a corresponding upper surface of the inner leads 25 differently from the first embodiment of the present invention, and the level difference is reduced between the top surface of the chip 29 and the top surface of the leads 23, on which is to be carried out a wire bonding, so as to facilitate a wire bonding process and shorten the length of wires 31 for thereby improving the electrical characteristics.

Figure 7:
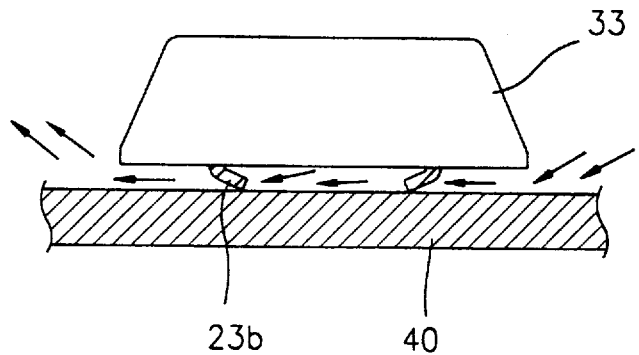
FIG. 7 is a cross-sectional view showing a bottom lead semiconductor package in accordance with the present invention mounted on a printed circuit board.

FIG. 7 shows the bottom lead semiconductor package according to the present invention mounted over a printed circuit board 40. As shown therein, the bottom surface of the package and the printed circuit board 40 are spaced apart due to the bent outer leads 23b having a prescribed height. Further, the connection of the outer leads 23b to the printed circuit board 40 can be easily checked through the space formed between the lower surface of the molding compound 33 and the printed circuit board 40. Moreover, a smooth air flow therethrough serves to facilitate emitting of the heat occurring from the package to the exterior.

In the bottom lead semiconductor package of the present invention, the outer leads are formed to protrude through the bottom surface of the package. A prescribed space between the package body and the printed circuit board can be secured. Through the space, a connection state of the outer leads to the printed circuit board can be easily checked while facilitating air circulation around the package body, thereby easily externally emitting the heat generated by the package.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A semiconductor package, comprising:
   a plurality of outer leads, an outer end portion of each of the outer leads extending in a first direction;
   a plurality of inner leads extending from corresponding ones of the outer leads and folded over onto a corresponding upper surface of the outer leads;
   a semiconductor chip attached to an upper surface of each of the inner leads by a insulating adhesive;
   a plurality of conductive media for electrically connecting the chip to the inner leads; and
   a molding compound for sealing the chip, a portion of the inner leads and the conductive media but externally exposing a portion of each of the outer leads.

2. The package of claim 1, wherein the plurality of outer leads include a groove on lower surfaces thereof respectively.

3. The package of claim 1, wherein the inner leads are plated with one of silver and gold.

4. The package of claim 1, wherein the outer leads are plated with one of lead and tin.

5. The package of claim 1, wherein an inner end portions of the inner leads are folded over onto a corresponding upper surface of an unbent portions thereof respectively.

6. The package of claim 1, wherein said outer end portions of said each of the outer leads extending in the first direction are downwardly bent.

7. The package of claim 6, wherein the downwardly bent outer end portions of the plurality of outer leads slant outward.

8. The package of claim 6, wherein the downwardly bent outer leads are bent over to be perpendicular to the lower surface of the molding compound.

9. The package of claim 1, wherein the chip is electrically connected to corresponding ones of the inner leads by at least one of conductive wires and bumps.

10. A chip package comprising:
    a plurality of leads, each having an outer lead and an inner lead, wherein said outer lead has first and second surfaces and an end portion, at least one of which is extended in a first direction and folded in a prescribed direction, and said inner lead extends from a corresponding one of the outer lead and has first and second surfaces and is folded such that the second surface of said inner lead overlaps the first surface of said outer lead;

a chip having a plurality of chip pads, said chip being mounted on said plurality of leads by an adhesive;

a conductive media coupling the chip pads to corresponding leads; and a package body that molds said chip, the conductive media and said leads, and said end portion of said outer lead is exposed.

11. The chip package of claim 10, wherein said package body is made of a molding compound.

12. The chip package of claim 10, wherein said chip is mounted on said inner lead of each of said plurality of leads by an adhesive.

13. The chip package of claim 10, wherein said conductive media are metallic wires coupled to the chip pads and the first surface of said inner lead of each of said plurality of leads.

14. The chip package of claim 10, wherein said package body encapsulates said chip.

15. The chip package of claim 10, wherein the second surface of said inner lead is in contact with the first surface of said outer lead.

16. The chip package of claim 10, wherein said end portion is in contact with the second surface of said outer lead.

17. The chip package of claim 10, wherein said end portion protrude substantially perpendicular to said package body.

18. The chip package of claim 10, wherein said end portion protrude at an inclined angle from said package body.

19. The chip package of claim 10, wherein an end of said inner lead opposite from an end extending from said outer lead is folded to overlap the first surface of the inner lead.

20. The chip package of claim 19, wherein said opposite end is in contact with the first surface of said inner lead.

21. The chip package of claim 10, wherein said end portion protrude at an inclined angle toward a center of said chip package.

22. A lead for a chip package comprising:

an outer lead and an inner lead, wherein said outer lead has first and second surfaces and an end portion, at least one of which is extended in a first direction and folded in a prescribed direction, and said inner lead extends from a corresponding one of the outer lead and has first and second surfaces and is folded such that the second surface of said inner lead overlaps the first surface of said outer lead, wherein an end of said inner lead opposite from an end extending from said outer lead is folded to be directly contacted with the first surface of said inner lead.

23. The lead of claim 22, wherein the second surface of said inner lead is in contact with the first surface of said outer lead.

24. The lead of claim 22, wherein said end portion is in contact with the second surface of said outer lead.

25. The lead of claim 22, wherein said end portion protrude substantially perpendicular to the chip package.

26. The lead of claim 22, wherein said end portion protrude at an inclined angle from the chip package.

27. The lead of claim 22, wherein said end portion protrude at an inclined angle toward a center of the chip package.

28. The package of claim 6, wherein the downwardly bent outer end portions of the plurality of outer leads slant inward.

* * * * *